US006429389B1

(12) United States Patent
Chung et al.

(10) Patent No.: US 6,429,389 B1
(45) Date of Patent: Aug. 6, 2002

(54) VIA-IN-PAD APPARATUS AND METHODS

(75) Inventors: Ji Yoon Chung, Hillsboro; Stephen C. Joy, Portland, both of OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/712,996

(22) Filed: Nov. 15, 2000

(51) Int. Cl.[7] .................................................. H01R 9/09

(52) U.S. Cl. ....................... 174/261; 174/262; 257/698; 438/667

(58) Field of Search ................................. 174/261, 262, 174/263; 361/766–772; 257/698, 767, 178, 633; 438/667

(56) References Cited

U.S. PATENT DOCUMENTS 4,924,295 A * 5/1990 Kuecher ..................... 257/767
5,811,736 A * 9/1998 Lauffer et al. .............. 174/263
6,171,946 B1 * 1/2001 Tsukamoto ................. 438/623
6,187,678 B1 * 1/2001 Gaynes et al. .............. 438/667
6,232,151 B1 * 5/2001 Ozmat et al. ............... 438/122

* cited by examiner

*Primary Examiner*—Albert W. Paladini
(74) *Attorney, Agent, or Firm*—Schwegman, Lundberg, Woessner & Kluth P.A.

(57) ABSTRACT

The electrical contacts of an integrated circuit are coupled to printed circuit board (PCB) bonding pads that include vias. A method for fabricating an electronic assembly utilizes at least one operation in which a thermally expansive substance, such as a volatile organic compound (VOC), is applied to the PCB. Some of the VOC goes into the via channels. The electrical contacts of a surface mount technology component such as a ball grid array (BGA) component are affixed to the bonding pads using a reflow soldering technique. According to one embodiment, the via channels are formed so as to inhibit bridging between adjacent BGAs during a solder reflow operation by minimizing outgassing of the VOC from the via channels. A substrate and an electronic system are also described.

25 Claims, 3 Drawing Sheets

103 SCREENER
110 110
102 108 108 MASK
5,6 5,6
104 105 104 PCB
100 115 115
112 106 106 150

VIA-IN-PAD APPARATUS AND METHODS

TECHNICAL FIELD OF THE INVENTION

The present invention relates generally to electronics packaging. More particularly, the present invention relates to apparatus and methods for coupling the electrical contacts of an integrated circuit to bonding pads having vias.

BACKGROUND OF THE INVENTION

Integrated circuits (ICs) are typically assembled into packages that are physically and electrically coupled to a substrate such as a printed circuit board (PCB) to form an "electronic assembly". The "electronic assembly" can be part of an "electronic system". An "electronic system" is broadly defined herein as any product comprising an "electronic assembly". Examples of electronic systems include computers (e.g., desktop, laptop, hand-held, server, etc.), wireless communications devices (e.g., cellular phones, cordless phones, pagers, etc.), computer-related peripherals (e.g., printers, scanners, monitors, etc.), entertainment devices (e.g., televisions, radios, stereos, tape and compact disc players, video cassette recorders, etc.), and the like.

In the field of electronic systems there is an incessant competitive pressure among manufacturers to drive the performance of their equipment up while driving down production costs. This is particularly true regarding the packaging of ICs on substrates, where each new generation of board-level packaging must provide increased performance while generally being smaller or more compact in size.

A substrate typically includes a number of insulation and metal layers selectively patterned to provide metal interconnect lines (referred to herein as "traces"), and a plurality of electronic components mounted on one or more surfaces of the substrate and functionally interconnected through the traces. The routing traces typically carry signals that are transmitted between the electronic components, such as ICs, of the system. Some ICs have a relatively large number of input/output (I/O) pads. The large number of I/O pads requires a relatively large number of routing traces. Some PCBs require multiple layers of routing traces to accommodate all of the system interconnections.

Routing traces located within different layers are typically connected electrically by vias formed in the board. A via can be made by making a hole through some or all layers of a PCB and then coating or plating the interior hole surface with an electrically conductive material, such as copper or tungsten.

In order to fabricate PCBs in which components, including IC packages, are mounted in higher densities, it is known to use a via-in-pad structure. In this structure, the exposed upper surface of certain vias is employed as a land, thus conserving valuable "real estate" on the PCB that would otherwise be separately occupied by the via and the land. The resulting electronic system can be manufactured at a lower cost and in a more compact size, and it is therefore more commercially attractive.

One of the conventional ways of mounting components on a substrate is called surface mount technology (SMT). SMT components have terminations or leads (generally referred to as "electrical contacts") that are soldered directly to the surface of the substrate. SMT components are widely used because of their compact size and simplicity of mounting. One conventional type of SMT component utilizes a ball grid array (BGA) to connect to the substrate. A BGA component has a plurality of solder balls on one surface, each of which represents an electrical contact. Each solder ball connects to a conductor within the component.

The electrical contacts of an SMT component, such as a BGA component, are coupled to corresponding metallized mounting or bonding pads (also referred to herein as "lands") on the surface of the substrate, in order to establish a secure physical connection to the substrate as well as to establish an electrical connection between the SMT component and at least one trace connected to the lands. Ordinarily one land is dedicated to one SMT electrical contact.

Prior to mounting the SMT component on a substrate, the substrate lands are selectively coated with solder paste. To mount an SMT component to a substrate, the component is carefully positioned or "registered" over the substrate so that its electrical contacts (e.g. solder balls) are aligned with the corresponding lands. Finally, the solder balls and lands are heated to a temperature that melts the solder balls and the solder paste, so that they physically merge and form proper electrical and physical connections.

In order to selectively coat the substrate lands with solder paste, a layer of solder mask or solder resist material is first applied to the substrate everywhere except the lands. Then, solder paste is applied to the substrate.

Both the solder mask and the solder paste can comprise one or more volatile materials. Such materials include volatile organic compounds (VOCs). One example of such a VOC is polyglycol, which is commonly used in PCB fabrication. Polyglycol has a boiling point of approximately 170 degrees Centigrade compared to the liquidus temperature of approximately 183 degrees Centigrade for solder paste.

For a PCB containing via-in-pads, problems can arise when the solder balls and lands are heated, because uncured or excessive VOC that resides in liquid form within the vias can expand or "outgas" upwards into the overlying solder balls. This causes the solder balls to expand to the point where adjacent solder balls can be left touching, creating short circuits. This phenomenon is referred to as "BGA bridging". In addition, the outgassing of VOCs can leave voids where the solder balls are supposed to make contact with the vias, creating open circuits.

For the reasons stated above, and for other reasons stated below which will become apparent to those skilled in the art upon reading and understanding the present specification, there is a significant need in the art for apparatus and methods for coupling an integrated circuit to a substrate that offer relatively high density while providing a relatively high quality interconnection.

DETAILED DESCRIPTION OF EMBODIMENTS OF THE INVENTION

In the following detailed description of embodiments of the invention, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present invention is defined only by the appended claims.

The present invention provides a solution to the problem of thermally expansive substances, such as volatile organic compounds (VOCs), outgassing during solder reflow to produce quality defects. Various embodiments are illustrated and described herein. In one embodiment, channels in via-in-pad structures are formed in such a manner as to minimize outgassing. By forming the via channels using a geometry that minimizes the volume of VOC material retained within the channels, the VOC material cures properly and/or does not outgas in an amount that causes adjacent solder balls to touch or cause opens between solder balls and their corresponding lands. Methods of fabrication, as well as application of the invention to a substrate, an electronic assembly, and an electronic system, are also described.

In addition to the foregoing advantages, the improved via-in-pad apparatus and methods of the present invention are compatible with existing packaging technologies, so that significant quality improvements are achieved at a relatively low implementation cost, thus making the apparatus and methods of the present invention commercially competitive.

Figure 1:
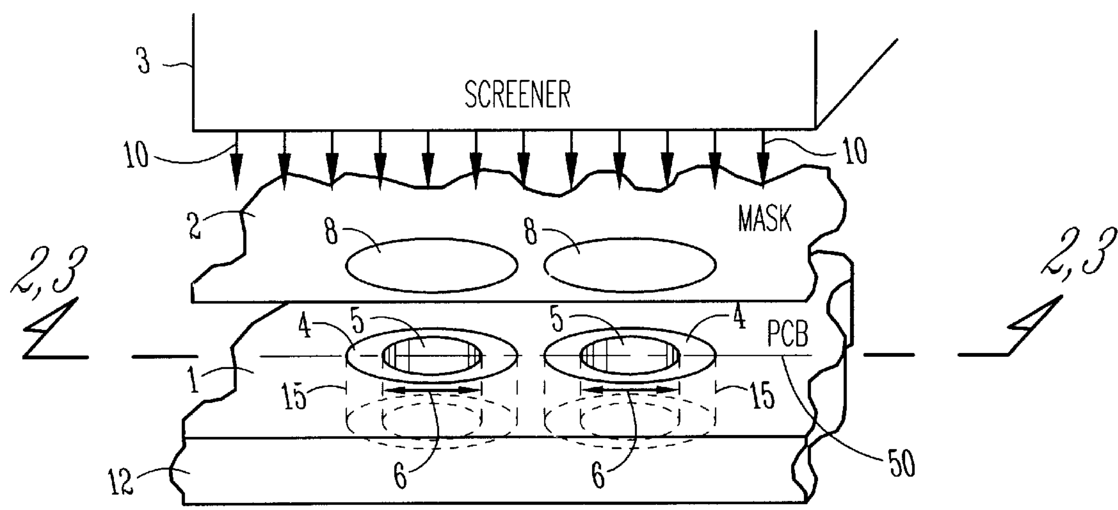
FIG. 1 is a perspective view of a prior art PCB, mask, and screener.

FIG. 1 is a perspective view of a prior art PCB 12, mask 2, and screener 3. A surface 1 of PCB 12 has a plurality of via-in-pad structures (only two of which are illustrated) each comprising a through-hole or via 15 having an opening or channel 5 and an upper surface that forms an O-shaped land 4. Solder can be applied to each land 4, and a corresponding solder ball on an IC package can be coupled to land 4, as will be shown below.

Land 4 is the upper surface of the channel wall of via 15. Although in the IC packaging technology vias can be either solid or hollow, as used herein the term "via" means a hollow via. Via 15 comprises electrically conductive material, such as copper, that electrically connects circuit traces on different layers (not shown) of PCB 12. Via 15 and its channel 5 can be of any type or cross-section but are typically circular. In the prior art structure illustrated in FIG. 1, via 15 is essentially a copper or copper-plated cylinder having a wall of finite thickness that extends partially into PCB 12 (as indicated by the dashed lines) or entirely through PCB 12, depending upon how many layers of the PCB it is required to connect to.

Channels 5 can be formed using a drill having a diameter of approximately 0.35 millimeters (13.8 mils) in one known prior art structure. The inside diameter 6 of each channel 5 is on the order of 0.25 to 0.28 millimeters (10 to 11 mils) in one known prior art structure after channels 5 are suitably finished, e.g. plated with a conductive material such as copper.

As mentioned in the Background section above, the lands 4 on PCB 12 need to be coated with solder paste in preparation for joining with the corresponding solder balls of an IC package. To this end, a mask 2 is positioned over surface 1 of PCB 12, and a screener apparatus 3 dispenses solder paste through apertures 8 in mask 2 in the direction indicated by arrows 10. The solder paste normally comprises a combination of solder powder, flux, a suspension agent, and a solvent. After this operation, the solder paste is allowed to cure or harden, during which time some or all of the liquid components evaporate, depending upon a number of process variables. As will be seen below, it is desirable that substantially all of the volatile liquid component(s) evaporate, because significant problems can occur when they do not, as will be illustrated below regarding FIG. 3.

It should be noted that other masks can be used to apply other materials containing volatile liquid components to the surface 1 of PCB 12 before application of the solder paste as described above with reference to FIG. 1. For example, solder resist can be applied to define the areas of the surface 1 of PCB 12 where solder paste is to be retained. In addition, volatile liquid components, e.g., solvents, can be applied to PCB 12 without using masks.

The volatile liquid components within the various materials that can be applied to the surface 1 of PCB 12 are thermally expansive substances, i.e. they expand when subjected to heat. These volatile liquid components can be of any suitable type, and they often include volatile organic compounds, such as polyglycol.

Figure 2:
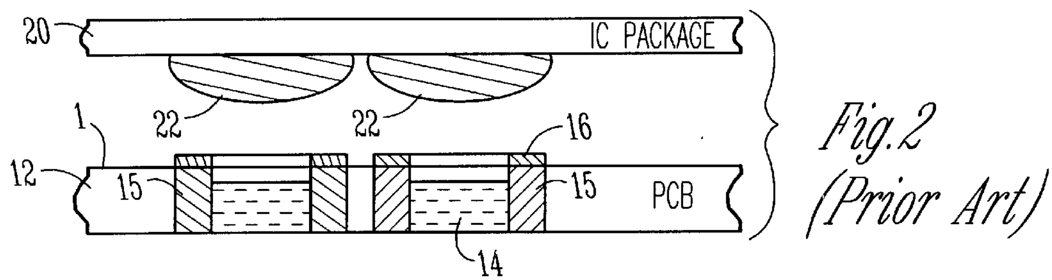
FIG. 2 is a cross-sectional view of the prior art PCB shown in FIG. 1 taken along line 50 of FIG. 1, and in addition a cross-sectional view of an IC package that is aligned for coupling to the prior art PCB.

FIG. 2 is a cross-sectional view of the prior art PCB 12 shown in FIG. 1 taken along line 50 of FIG. 1, and in addition a cross-sectional view of an IC package 20 that is aligned for coupling to the prior art PCB 12. Vias 15 are shown containing a thermally expansive substance, such as "via fill" 14, which in the prior art structure can include both cured material as well as thermally expansive material such as a volatile organic compound. The particular level of via fill 14 within vias 15 is merely illustrative; the level can range anywhere between full to empty.

As a result of an operation in which a solder paste material is applied to the upper surface 1 of PCB 12, solder paste 16 resides on the exposed upper surfaces (i.e. lands 4, FIG. 1) of vias 15.

IC package 20 comprises a plurality (only two of which are illustrated) of contacts, bumps, or balls 22, each comprising an electrically conductive material such as solder. Solder balls 22 are of approximately the same shape, size, and pitch as lands 4. Solder balls 22 are aligned or "registered" with respect to lands 4.

In as subsequent operation (not illustrated), the solder balls 22 and the lands 4, which have been coated with solder paste 16, are heated substantially to the melting point or liquidus of the solder material, so that balls 2 and lands 4 flow together and become physically and electrically coupled upon cooling.

Figure 3:
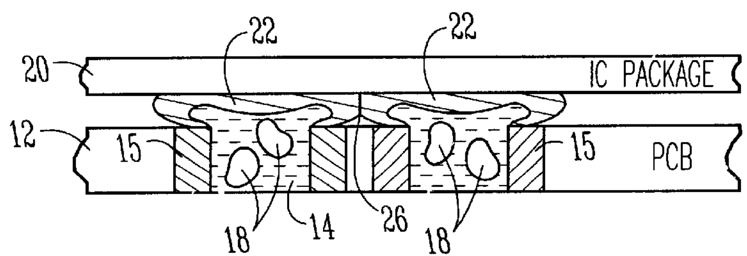
FIG. 3 shows the prior art PCB shown in FIG. 2 coupled to an IC package in which adjacent solder balls are bridged.

FIG. 3 shows the prior art PCB 12 shown in FIG. 2 coupled to an IC package 20 in which adjacent solder balls 22 are bridged. Due to the presence of unevaporated thermally expansive material within the via fill 14 when the prior art structure is heated to the solder liquidus, voids 18 are formed within the via fill 14, causing the via fill 14 to significantly expand. The via fill 14 outgasses and bubbles into the overlying liquid solder balls 22, causing solder balls 22 to expand laterally in a ballooning effect. When solder balls 22 touch, as shown at the area 26, shorts result, and the electronic structure can experience operational faults or even total failure.

Figure 4:
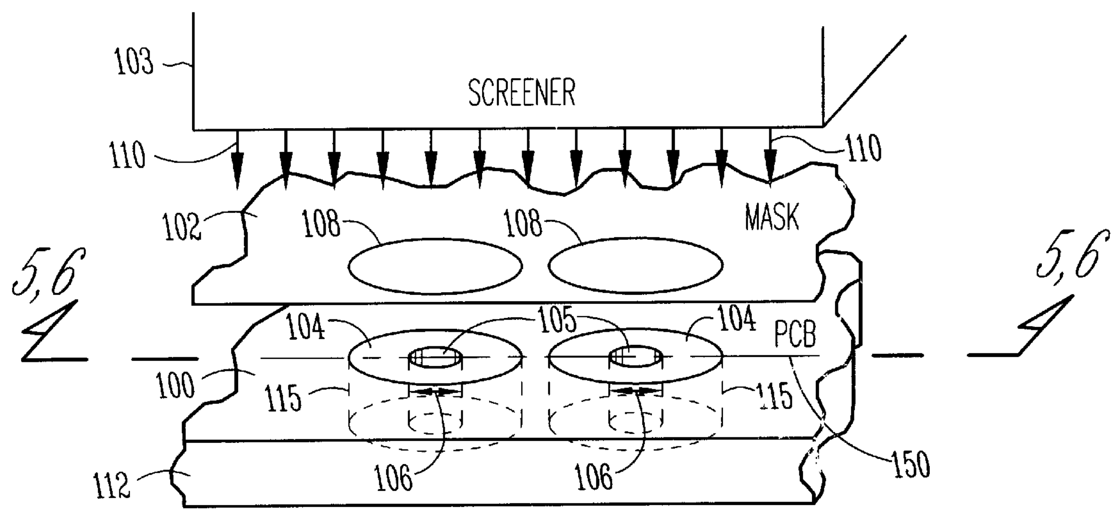
FIG. 4 is a perspective view of a PCB, mask, and screener, in accordance with one embodiment of the invention.

FIG. 4 is a perspective view of a PCB 112, mask 102, and screener 103, in accordance with one embodiment of the invention.

A surface 100 of PCB 112 has a plurality of via-in-pad structures (only two of which are illustrated) each comprising a through-hole or via 115 having an opening or channel 105 and an upper surface that forms an O-shaped land 104.

Land 104 is the upper surface of the channel wall of via 115. Via 115 and its channel 105 can be of any type or cross-section, but in the embodiment shown they are circular. Via 115 can extend partially into PCB 112 (as indicated by the dashed lines) or entirely through PCB 112, depending upon how many layers of the PCB it is required to connect to. In one embodiment, the diameter of land 104 is on the order of 0.50 to 0.66 millimeter (20 to 26 mils).

Further, in one embodiment, the inside diameter 106 of each channel 105 is on the order of 0.20 to 0.23 millimeters (8 to 9 mils). Channels 105 having a finished diameter of 0.20 to 0.23 millimeters can be formed using a drill having a diameter of approximately 0.30 millimeters (11.8 mils) according to one embodiment. The diameter of channels 105 will typically be less than the drill diameter after channels 105 are suitably finished, e.g. plated with a conductive material such as copper.

Channels 105 are significantly narrower, relative to the diameter of lands 104, than those of the prior art structure illustrated in FIG. 1. Channels 105, in the embodiment shown in FIG. 4, are approximately 35% (0.23 mm÷0.66 mm) of the pad diameter, as opposed to approximately 42% (0.28 mm÷0.66 mm) of the pad diameter for the prior art structure shown in FIG. 1.

In a manner similar to that described above regarding FIG. 1, lands 104 on PCB 112 are coated with solder paste in preparation for joining with the corresponding solder balls of an IC package. To this end, a mask 102 is positioned over surface 100 of PCB 112, and a screener apparatus 103 dispenses solder paste through apertures 108 in mask 102 in the direction indicated by arrows 110. The solder paste normally comprises a combination of solder powder, flux, a suspension agent, and a solvent. After this operation, the solder paste is allowed to cure or harden, during which time some or all of the liquid components evaporate, depending upon a number of process variables.

In a similar fashion as mentioned earlier regarding the prior art structure shown in FIG. 1, other materials containing volatile liquid components can be applied to the surface 100 of PCB 112, whether through the use of a mask or not, before application of the solder paste as described above with reference to FIG. 4. For example, solder resist can be applied to define the areas of the surface 100 of PCB 112 where solder paste is to be retained.

The volatile liquid components within the various materials that can be applied to the surface 100 of PCB 112 are thermally expansive substances, i.e. they expand when subjected to heat. As for the prior art structure discussed earlier, these volatile liquid components can be of any suitable type, and they often include volatile organic compounds, such as polyglycol.

Figure 5:
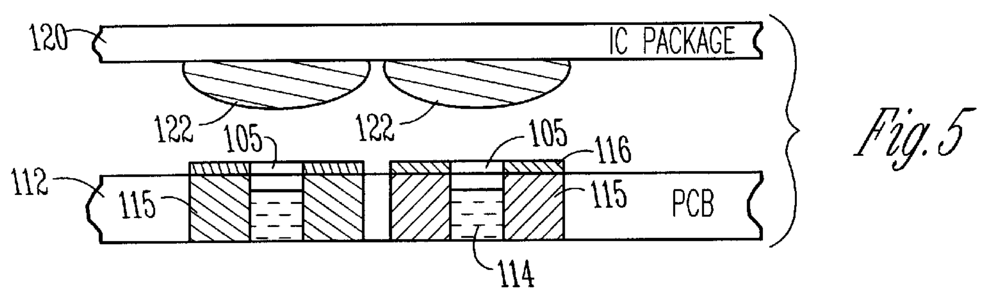
FIG. 5 is a cross-sectional view of the PCB shown in FIG. 4 taken along line 150 of FIG. 4, and in addition a cross-sectional view of an IC package aligned to be coupled to the PCB, in accordance with one embodiment of the invention.

FIG. 5 is a cross-sectional view of the PCB 112 shown in FIG. 4 taken along line 150 of FIG. 4, and in addition a cross-sectional view of an IC package 120 aligned to be coupled to the PCB 112, in accordance with one embodiment of the invention. PCB 112 and IC package 120 form an electronic assembly that can be part of an electronic system.

As discussed earlier regarding the prior art structure illustrated in FIG. 2, the channels 105 of vias 115 are shown containing a thermally expansive substance, such as "via fill" 114, which can include both cured material as well as thermally expansive material such as a volatile organic compound. The particular level of via fill 114 within vias 115 is merely illustrative; the level can range anywhere between full to empty.

A typical range of "via plug volume percentage" (i.e. the percentage of the via that is filled with via fill material) in the industry is approximately 10% to 40%. It will be understood by those of ordinary skill in the art, that at relatively low values of "via plug volume percentage", there is a higher probability that thermally expansive substances in the via fill will cure properly, and thus the contribution of the present invention would not be as significant for these values of "via plug volume percentage" as it is when the "via plug volume percentage" is higher, e.g. in the range of 30% to 100%. In general, the greater the "via plug volume percentage", the greater the advantages of utilizing the present invention.

As a result of an operation in which a solder paste material is applied to the upper surface 100 of PCB 112, solder paste 116 resides on the exposed upper surfaces (i.e. lands 104, FIG. 4) of vias 115.

IC package 120 comprises a plurality (only two of which are illustrated) of contacts, bumps, or balls 122, each comprising an electrically conductive material such as solder. Solder balls 122 are of approximately the same shape, size, and pitch as lands 104. Solder balls 122 are aligned or "registered" with respect to lands 104.

In as subsequent operation (not illustrated), the solder balls 122 and the lands 104, which have been coated with solder paste 116, are heated substantially to the melting point or liquidus of the solder material, so that balls 122 and lands 104 flow together and become physically and electrically coupled upon cooling.

Figure 6:
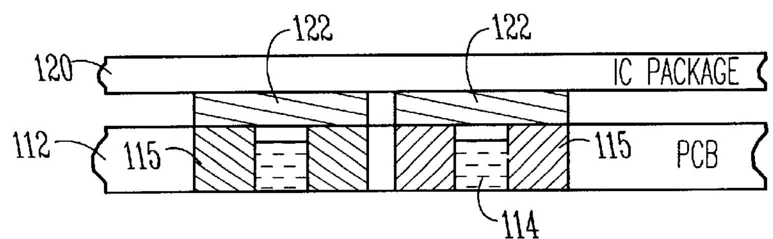
FIG. 6 shows the PCB of the present invention coupled to an IC package, in accordance with one embodiment of the invention.

FIG. 6 shows the PCB 112 of the present invention coupled to an IC package 120, in accordance with one embodiment of the invention. Due to the substantial reduction or total absence of unevaporated thermally expansive material within the via fill 114 when the electronic assembly illustrated in FIG. 5 is heated to the solder liquidus, few if any significant voids are formed within the via fill 114. Solder balls 122 melt into the solder paste 116 (FIG. 5) of corresponding lands 104 (FIG. 4), causing solder balls 122 to form high quality physical and electrical connections to lands 104. The resulting electronic assembly achieves a significantly higher level of integrity and can be produced at a significantly lower cost.

The substantial reduction or absence of unevaporated thermally expansive material is achieved by controlling the geometry of the via channel so as to inhibit the thermally expansive substances from causing adjacent contacts or solder balls on the IC package from touching. For example, in a preferred embodiment, the via channels 105 are formed narrow enough, compared with those of prior art structures, that the amount of via fill 114 residing in the via channels 105 is substantially reduced. By reducing the volume of via fill 114 in the via channels 105 and by employing narrower via channels 105, the thermally expansive -substances in the via fill 114 have a greater probability of completely curing. However, even if they fail to completely cure, the volume of the via fill 114 in the narrower via channels 105 has been reduced sufficiently to minimize the effect of outgassing from volatile substances remaining within the via fill 114 occupying the via channels 105. As a result, even if outgassing should occur, its effect upon solder balls 122 is inconsequential.

Figure 7:
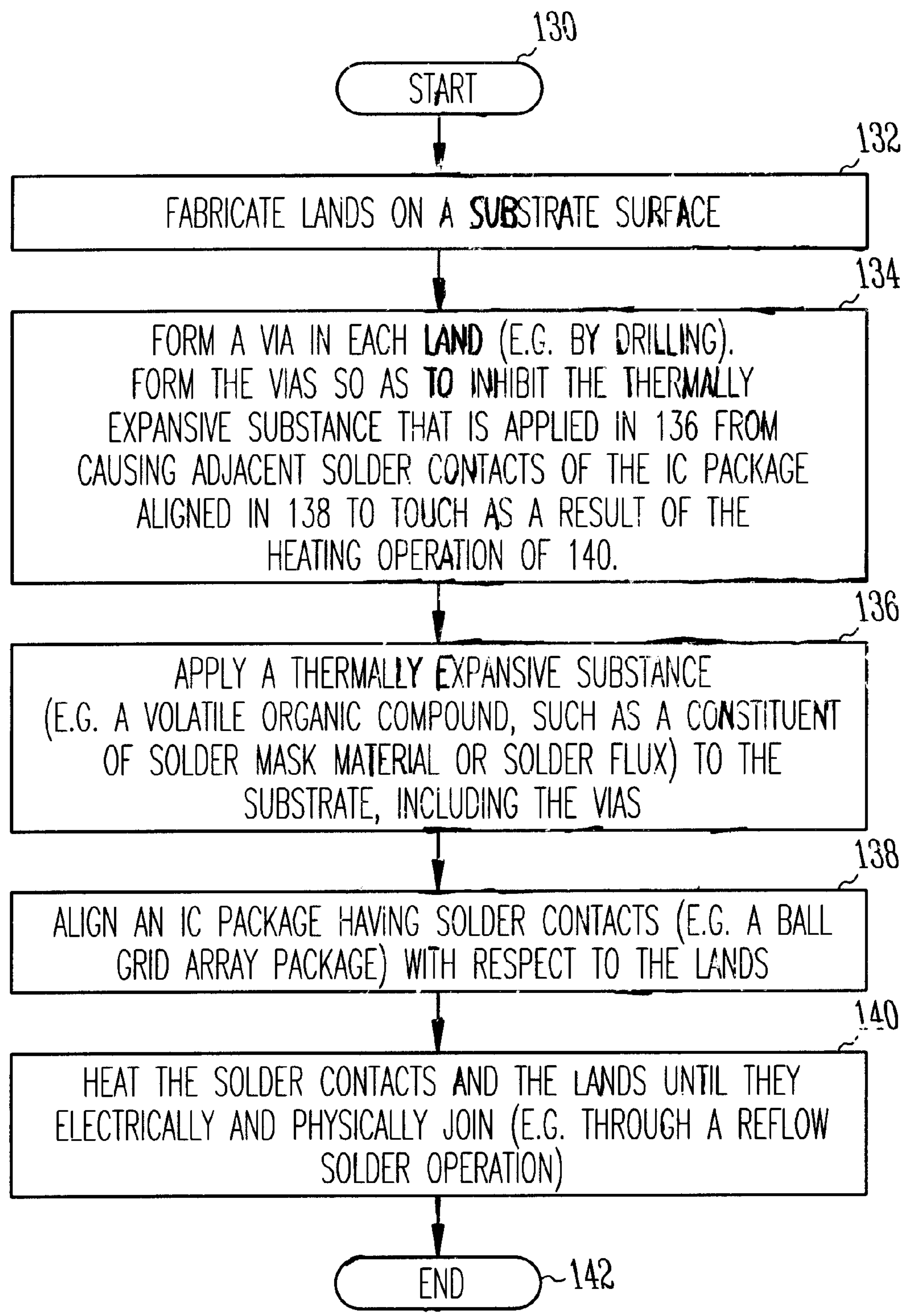
FIG. 7 is a flow diagram of a method of fabricating an electronic assembly that includes forming vias in lands in such as manner as to inhibit adjacent solder balls from bridging, in accordance with one embodiment of the invention.

FIG. 7 is a flow diagram of a method of fabricating an electronic assembly that includes forming vias in lands in such as manner as to inhibit adjacent solder balls from bridging, in accordance with one embodiment of the invention. The method begins at 130.

In 132, a plurality of lands are fabricated on a surface of a substrate such as a PCB.

In 134, a via is formed in each land. In one embodiment, the vias are formed by drilling; however, the scope of the invention is not limited to drilling, and any suitable process for forming vias can be used, such as punching, microperforation, ablation, laser blasting, etching, and so forth. The vias are formed so as to inhibit one or more thermally expansive substances (such as that applied in 136) from causing adjacent solder contacts, e.g. solder balls, of the IC package (such as that referred to in 138) to touch as a result of a heating operation (such as that referred to in 140), e.g. a solder reflow operation.

In 136, a thermally expansive substance is applied to the substrate, including the vias of the substrate. The thermally expansive substance can be of any type, including a volatile organic compound. The thermally expansive substance can be a constituent of a solder mask or solder resist material, or of a solder flux, or of any other material that can be applied to the substrate for any purpose prior to a heating operation.

In 138, an IC package having a plurality of solder contacts (e.g. solder balls in a ball grid array configuration) is aligned with respect to the lands on the substrate surface.

In 140, a heating operation (e.g. a solder reflow operation) is carried out in which the solder contacts and the lands are heated until they electrically and physically join. The method ends at 142.

PCB 112 can be any type of substrate on which electrical components can be mounted, such as a material formed of polyimide, a suitable organic material, silicon, glass, quartz, ceramic, and the like.

The electrical component in the package that is mounted to PCB 112 can be of any type, such as an IC or other semiconductor device; a passive element such as an inductor, capacitor, or resistor; or any other kind of electrical or electronic device.

The IC in IC package 120 can be of any type, such as a microprocessor or microcontroller, memory circuit, application specific integrated circuit (ASIC), digital signal processor (DSP), a radio frequency circuit, an amplifier, a power converter, a filter, a clocking circuit, and the like.

The operations described above with respect to FIG. 7 can be performed in a different order from those described herein.

The present invention provides significantly improved reliability of the solder connections between the electrical contacts of electronic components, such as surface mount technology components, e.g. ball grid array devices, and corresponding via-in-pad type lands on substrates, e.g., printed circuit boards. By forming the in-pad vias with proper geometry, including maximum diameters preferably within the range of 0.20 to 0.23 millimeters (8 to 9 mils), the amount of thermally expansive substances, such as volatile organic compounds (VOCs), residing within the vias is minimized, enabling the VOCs to cure properly. As a result, the problem of VOCs vaporizing and expanding into solder balls to the extent that adjoining solder balls can come into contact with each other is significantly reduced.

As shown herein, the present invention can be implemented in a number of different embodiments, including a method for fabricating an electronic assembly, an electronic assembly, an improved substrate, and an electronic system. Other embodiments will be readily apparent to those of ordinary skill in the art. The elements, architecture, dimensions, and sequence of operations can all be varied to suit particular product and test requirements.

The various elements depicted in the drawings are merely representational and are not drawn to scale. Certain proportions thereof may be exaggerated, while others may be minimized. The drawings are intended to illustrate various implementations of the invention, which can be understood and appropriately carried out by those of ordinary skill in the art.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A method comprising:

fabricating a plurality of lands on a surface of a substrate, each land having a diameter;

forming a via in each land, each via having an opening with a diameter not exceeding 35% of the diameter of the corresponding land;

applying a thermally expansive substance to the surface;

aligning an integrated circuit package having contacts comprising electrically conductive material with respect to the lands; and heating the electrically conductive material and the lands until they join.

2. The method recited in claim 1 wherein, in aligning, the contacts form a portion of a ball grid array.

3. The method recited in claim 1 wherein, in applying, the thermally expansive substance comprises a volatile organic compound.

4. The method recited in claim 3 wherein, in applying, the volatile organic compound forms a portion of a solder mask.

5. The method recited in claim 3 wherein, in applying, the volatile organic compound forms a portion of a solder flux.

6. The method recited in claim 1 wherein, in aligning, the electrically conductive material comprises solder.

7. The method recited in claim 1 wherein, in forming, the via openings are formed by drilling.

8. The method recited in claim 7 wherein, in forming, the via openings do not exceed 0.23 millimeters in diameter.

9. A method for fabricating an electronic assembly comprising:

fabricating a plurality of lands on a surface of a substrate, each land having a diameter;

forming a via in each land, the via comprising an opening with a diameter not exceeding 35% of the diameter of the corresponding land;

applying a material over the surface of the substrate, including the openings, the material comprising a thermally expansive substance;

aligning an integrated circuit package having contacts comprising electrically conductive material with respect to the lands; and heating the electrically conductive material and the lands until they join.

10. The method recited in claim 9 wherein, in aligning, the contacts form a portion of a ball grid array.

11. The method recited in claim 9 wherein, in applying, the thermally expansive substance comprises a volatile organic compound.

12. The method recited in claim 11 wherein, in applying, the volatile organic compound forms a portion of a solder mask.

13. The method recited in claim 11 wherein, in applying, the volatile organic compound forms a portion of a solder flux.

14. The method recited in claim 9 wherein, in aligning, the electrically conductive material comprises solder.

15. The method recited in claim 9 wherein, in forming, the vias are formed by drilling.

16. The method recited in claim 15 wherein, in forming, the via openings do not exceed 0.23 millimeters in diameter.

17. An electronic assembly comprising:

a substrate; and a plurality of lands on the substrate, each land having a diameter, each land further having a via having an opening with a diameter not exceeding 35% of the diameter of the corresponding land, and each land being aligned with respect to a contact of an integrated circuit package.

18. The electronic assembly recited in claim 17 wherein the via openings have a diameter not exceeding 0.23 millimeters.

19. The electronic assembly recited in claim 17 wherein the via openings have a maximum diameter not exceeding a range of 30% to 35% of the diameter of their respective lands.

20. A substrate comprising a plurality of lands, each land having a diameter, each land further having a via channel therein, wherein each via channel has a diameter not exceeding 0.35% of the diameter of the corresponding land.

21. The substrate recited in claim 20 wherein each via channel has a diameter not exceeding 0.23 millimeters.

22. The substrate recited in claim 20 wherein each via channel has a maximum diameter in the range of 0.20 to 0.23 millimeters.

23. An electronic system comprising an electronic assembly having a substrate, a plurality of lands on the substrate, each land having a diameter, each land further having a via, each land being aligned with respect to a contact of an integrated circuit package, and each via having an opening with a diameter not exceeding 35% of the diameter of the corresponding land.

24. The electronic system recited in claim 23 wherein the vias have a maximum diameter in the range of 0.20 to 0.23 millimeters.

25. The electronic system recited in claim 23 wherein the via openings have a maximum diameter not exceeding a range of 30% to 35% of the diameter of their respective lands.

* * * * *